US009433107B2

(12) United States Patent
Seo et al.

(10) Patent No.: US 9,433,107 B2
(45) Date of Patent: Aug. 30, 2016

(54) PRINTED CIRCUIT BOARD AND METHOD OF MANUFACTURING THE SAME

(71) Applicant: LG INNOTEK CO., LTD., Seoul (KR)

(72) Inventors: Hyun Seok Seo, Seoul (KR); Ki Do Chun, Seoul (KR); Sang Myung Lee, Seoul (KR); Yeong Uk Seo, Seoul (KR); Chang Woo Yoo, Seoul (KR); Byeong Ho Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/365,920

(22) PCT Filed: Dec. 12, 2012

(86) PCT No.: PCT/KR2012/010767
§ 371 (c)(1),
(2) Date: Jun. 16, 2014

(87) PCT Pub. No.: WO2013/089418
PCT Pub. Date: Jun. 20, 2013

(65) Prior Publication Data
US 2014/0360761 A1    Dec. 11, 2014

(30) Foreign Application Priority Data

Dec. 15, 2011 (KR) .......... 10-2011-0135962

(51) Int. Cl.
H05K 1/00 (2006.01)
H05K 1/11 (2006.01)
(Continued)

(52) U.S. Cl.
CPC .......... *H05K 3/4644* (2013.01); *H05K 1/0298* (2013.01); *H05K 1/115* (2013.01);
(Continued)

(58) Field of Classification Search
CPC ............... H05K 3/429; H05K 3/4601; H05K 1/11–1/115; H05K 2201/09472; H05K 2201/09481; H05K 2201/095; H05K 2201/09509; H05K 2201/09518; H05K 2201/09527; H05K 2201/09536; H05K 2201/09545; H05K 2201/09563
USPC ......... 174/260–262, 264, 266; 361/748, 760, 361/777, 803
See application file for complete search history.

(56) References Cited

U.S. PATENT DOCUMENTS

2008/0041621 A1* 2/2008 Hsu et al. ..................... 174/262
2008/0052905 A1* 3/2008 Watanabe et al. .............. 29/846
(Continued)

FOREIGN PATENT DOCUMENTS

JP    2002076530 A    3/2002
JP    2002-184729 A    6/2002
(Continued)

OTHER PUBLICATIONS

International Search Report in International Application No. PCT/KR2012/010767, filed Dec. 12, 2012.
(Continued)

*Primary Examiner* — Hoa C Nguyen
(74) *Attorney, Agent, or Firm* — Saliwanchik, Lloyd & Eisenschenk

(57) ABSTRACT

Provided is a printed circuit board, including a plurality of buried circuit patterns which are formed in an active area; and a plurality of buried dummy patterns which are uniformly formed in a dummy area except the active area. Thus, since when the circuit patterns are formed, the dummy patterns are also uniformly formed, a difference in plating can be reduced. Also, since the dummy patterns are uniformly formed in the dummy area, a difference in grinding between the dummy area and the active area can be reduced, thereby enabling the circuit patterns to be formed in the active area without the occurrence of over-grinding.

11 Claims, 4 Drawing Sheets

(51) Int. Cl.
*H05K 3/46* (2006.01)
*H05K 1/02* (2006.01)
*H05K 3/06* (2006.01)
*H05K 1/09* (2006.01)

(52) U.S. Cl.
CPC ............... *H05K 3/465* (2013.01); *H05K 1/09* (2013.01); *H05K 3/06* (2013.01); *H05K 2201/0376* (2013.01); *H05K 2201/09781* (2013.01); *H05K 2201/10204* (2013.01); *H05K 2203/0353* (2013.01)

(56) References Cited

U.S. PATENT DOCUMENTS

2008/0179744 A1* 7/2008 Yu ................................ 257/750
2011/0089138 A1 4/2011 Ko et al.
2011/0139494 A1* 6/2011 Yu et al. ....................... 174/255

FOREIGN PATENT DOCUMENTS

| | | |
|---|---|---|
| JP | 2002359452 A | 12/2002 |
| KR | 10-2002-0040091 A | 5/2002 |
| KR | 10-0890447 B1 | 3/2009 |
| KR | 10-2010-0048278 A | 5/2010 |
| KR | 10-2010-0114704 A | 10/2010 |
| KR | 10-2011-0042977 A | 4/2011 |
| TW | 2010-39704 A | 11/2010 |

OTHER PUBLICATIONS

Office Action dated Jun. 21, 2016 in Chinese Application No. 201280069928.4.

* cited by examiner

PRINTED CIRCUIT BOARD AND METHOD OF MANUFACTURING THE SAME

CROSS-REFERENCE TO RELATED APPLICATIONS

This application is the U.S. national stage application of International Patent Application No. PCT/KR2012/010767, filed Dec. 12, 2012, which claims priority to Korean Application No. 10-2011-0135962, filed Dec. 15, 2011, the disclosures of each of which are incorporated herein by reference in their entirety.

TECHNICAL FIELD

The present invention relates to a printed circuit board and a method of manufacturing the same.

BACKGROUND ART

A printed circuit board (PCB) is formed by printing a circuit line pattern on an electric insulating substrate with a conductive material such as Cu, and is called a board just before electronic components are mounted. That is, the printed circuit board means a circuit board which is configured such that to closely mount many kinds of electronic devices on a flat board, positions for mounting each component are determined, and a circuit pattern for connecting the components is printed on and is fixed to a surface of the flat board.

Meanwhile, to cope with the recent trend of high performance and small-sized electronic components, a buried pattern capable of making a surface of the board even at the same time as reducing a thickness of the printed circuit board has been used.

FIG. 1 illustrates a general buried-type printed circuit board.

As shown in FIG. 1, a buried-type printed circuit board 10 is configured such that a buried pattern groove 2 is formed on a surface of an insulating substrate 1, and a circuit pattern 3 is formed by burying the buried pattern groove 2 using plating.

In the printed circuit board 10 on which the buried pattern 3 is formed, due to a formation structure of the base circuit pattern and a contact part, a bonding force with an insulating member becomes very high, and pitches of the base circuit pattern and the contact part are uniformly and minutely formed. However, in the case of forming the buried circuit pattern 3 using plating, a difference in plating between an area, in which the pattern groove 2 is formed, and the rest of the area is generated. Thus, upon etching after plating, the etching is not uniformly performed. Accordingly, like FIG. 1, since the etching is not performed at one area of the circuit pattern 3, a short between the adjacent circuit patterns occurs, and since the etching is excessively performed at another area, an error in signal transmission occurs.

DISCLOSURE OF INVENTION

Technical Problem

An aspect of the present invention provides a printed circuit board having a new structure and a method of manufacturing the same.

Another aspect of the present invention provides a printed circuit board without a difference in plating thickness and a method of manufacturing the same.

Solution to Problem

According to an aspect of the present invention, there is provided a printed circuit board, including: a plurality of buried circuit patterns which are formed in an active area; and a plurality of buried dummy patterns which are uniformly formed in a dummy area except for the active area.

According to another aspect of the present invention, there is provided a method of manufacturing a printed circuit board, including: preparing an insulating substrate which defines an active area in which a circuit pattern and a device are formed and a dummy area except for the active area; and forming a plurality of dummy patterns so as to be uniformly disposed in the dummy area at the same time as forming a plurality of circuit patterns in the active area.

Advantageous Effects of Invention

According to the present invention, since when the circuit patterns are formed, the dummy patterns are also uniformly formed, a difference in plating can be reduced.

Also, since the dummy patterns are uniformly formed in the dummy area, a difference in grinding between the dummy area and the active area can be reduced, thereby enabling the circuit patterns to be formed in the active area without the occurrence of over-grinding.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Hereinafter, preferred embodiments of the present invention will be described in detail with reference to the accompanying drawings in such a manner that the present could be easily implemented by those having ordinary skill in the art to which the present invent pertains. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

To clearly explain the present invention, the parts which have no relation with the explanation are omitted, and to clearly express various layers and areas, their thicknesses are enlarged. Also, like numbers may refer to like elements throughout the description of the figures.

When it is mentioned that a part such as a layer, a film, an area, a plate and the like is "above" other part, this includes a case in which the part is just above the other part as well as a case in which still another part is in their middle. On the contrary, when it is mentioned that a part is just above other part, this means that there is no still another part in their middle.

With respect to a printed circuit board in which a circuit pattern is formed in a buried type, the present invention provides a method of preventing a short between adjacent circuit patterns by uniformly forming the circuit patterns through grinding.

Hereinafter, a printed circuit board according to one exemplary embodiment of the present invention will be explained with reference to FIG. 2 through FIG. 9.

Figure 2:
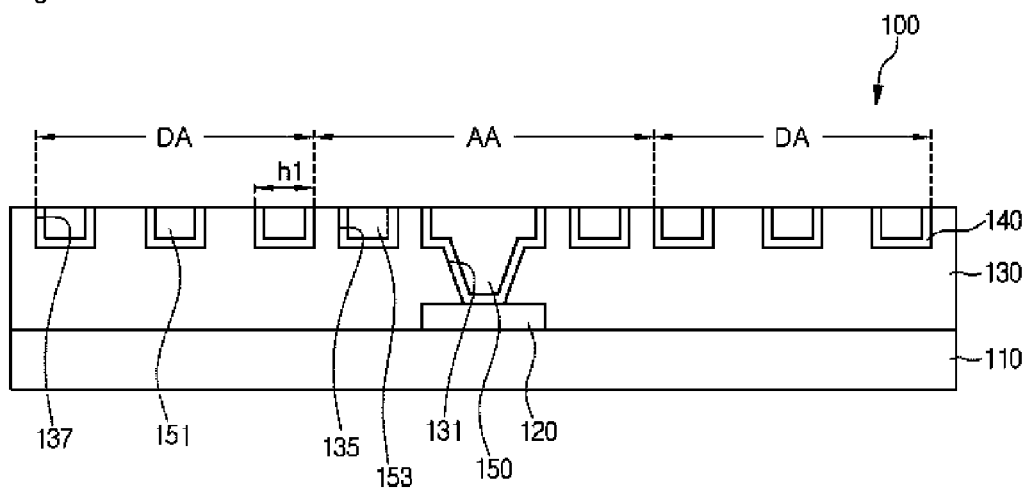
FIG. 2 is a cross-sectional view of a printed circuit board according to the present invention.

FIG. 2 is a cross-sectional view of a printed circuit board according to one exemplary embodiment of the present invention.

Referring to FIG. 2, a printed circuit board 100 according to the present invention includes: an insulating plate 110 a first circuit pattern 120 formed on the insulating plate 110; an insulating layer 130; and a plurality of second circuit patterns 153.

The printed circuit board 100 includes: an active area AA in which the second circuit patterns 153 and a pad for mounting a plurality of devices are formed; and a dummy area DA including a dummy pattern 151.

The dummy area DA is defined as an area except for the active area AA in the printed circuit board 100.

The dummy areas DA may be located between the active areas AA. Like FIG. 2, the dummy area DA may be formed to surround the active area AA.

The dummy area DA is electrically insulated from the active area AA.

The insulating plate 110 may be a thermosetting or a thermoplastic polymer substrate, a ceramic substrate, a substrate of an organic-inorganic composite material, or a glass fiber-impregnated substrate. When the insulating plate 110 includes a polymer resin, it may include an epoxy insulating resin. Unlike this, the insulating plate 110 may also include a polyimide-based resin.

As a base circuit pattern, the plurality of first circuit patterns 120 are formed on the insulating plate 110.

The first circuit pattern 120 may be formed of a material having a high electric conductivity and low resistance, and may be also formed by patterning a copper foil layer, which is a thin copper layer, as a conductive layer. When the first circuit pattern 120 is the copper foil layer, and the insulating plate 110 includes resins, the first circuit pattern 120 and the insulating plate 110 may be a normal copper clad laminate CCL.

Meanwhile, the insulating layer 130 is formed on the insulating plate 110 to bury the first circuit pattern 120.

The insulating layer 130 may be formed in the plurality of insulating layers 130, and each insulating layer 130 may be a polymer resin and the like.

Among the plurality of insulating layers 130, the insulating layer 130 of the active area AA includes: a via hole 131 to which the first circuit pattern 120 is exposed; and a circuit pattern groove 135 for forming the plurality of second circuit patterns 153. The insulating layer 130 of the dummy area DA includes a dummy pattern groove 137 for forming the dummy pattern 151.

The dummy pattern groove 137 may be uniformly formed with respect to the dummy area DA, and the plurality of dummy patterns may be regularly formed in the dummy area.

Each dummy pattern 151 has a pattern width d1 of less than 50 μm.

Meanwhile, the circuit pattern groove 131 may range from 3 to 25 μm in pattern width and 3 to 25 μm in pattern depth. Furthermore, an intaglio of the via hole 131 may satisfy about less than 80 μm in diameter, and may satisfy about less than 100 μm in depth.

A metal layer 140 is formed in an inner part of the plurality of via holes 131, the circuit pattern groove 135 and the dummy pattern groove 137 of the insulating layer 130.

The metal layer 140 is a seed layer. The metal layer may be formed of Cu, Ni or an alloy thereof.

The second circuit patterns 153, a dummy pattern 151 and a via 150 for burying the circuit pattern grooves 135, 137 and the via hole 131 are formed on the metal layer 140.

The second circuit patterns 153, the dummy pattern 151 and the via 150 may be simultaneously formed together, and may be formed of an alloy including at least one of Al, Cu, Ag, Pt, Ni and Pd, and by plating the metal layer 140 as the seed layer.

The printed circuit board 100 as shown in FIG. 2 is configured such that the plurality of dummy patterns 151 are formed with the same layer as the second circuit patterns and in the dummy area DA as well as the active area AA in which the second circuit patterns 153, the via 150 and the like are formed.

These dummy patterns 151 may be formed by the same process as the second circuit patterns 153. Also, since the dummy patterns 151 are simultaneously formed with the second circuit patterns 153, no process increases, and plating and grinding processes are uniformly performed, thereby preventing the second circuit patterns 153 from being excessively ground.

Hereinafter, a method of manufacturing the printed circuit board 100 of FIG. 2 will be explained with reference to FIG. 3 through FIG. 9.

Figure 3:
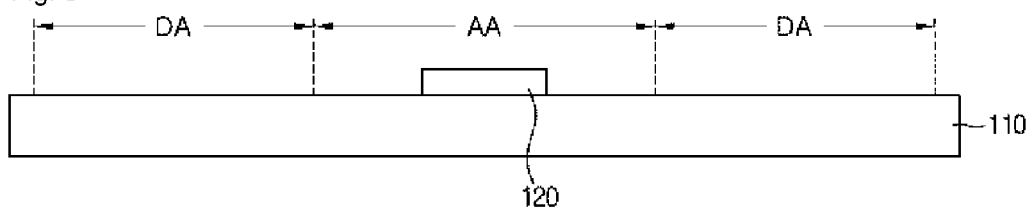
FIG. 3 through FIG. 9 are cross-sectional views showing a method of manufacturing the printed circuit board of the present invention.

First, like FIG. 3, the first circuit pattern 120 is formed on the insulating plate 110

The configurations of the insulating plate 110 and the first circuit pattern 120 may be formed by etching the copper foil layer of the CCL according to a design of the first circuit pattern 120. Unlike this, they may be also formed by laminating the copper foil layer on the insulating plate 110 of a ceramic substrate and thereafter etching it.

At this time, the first circuit pattern 120 may also include a pattern connected to the second circuit patterns 153 through the via hole 131 as shown in FIG. 2.

Figure 4:
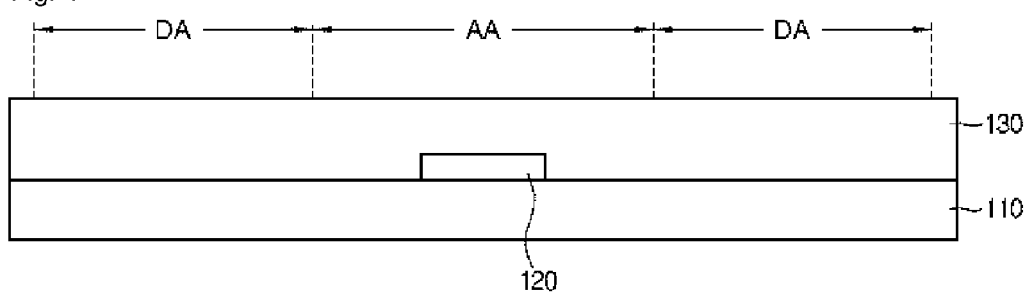

Next, the insulating layer 130 of FIG. 4 is formed to bury the first circuit pattern 120 in the insulating plate 110.

The insulating layer 130 may be formed by applying a thermosetting resin and a half-hardened resin, which is not completely hardened, to the insulating plate 110 in a predetermined thickness, and hardening it by applying heat and pressure thereto. Furthermore, the insulating layer 130 may be also formed in a plurality of layers.

Figure 5:
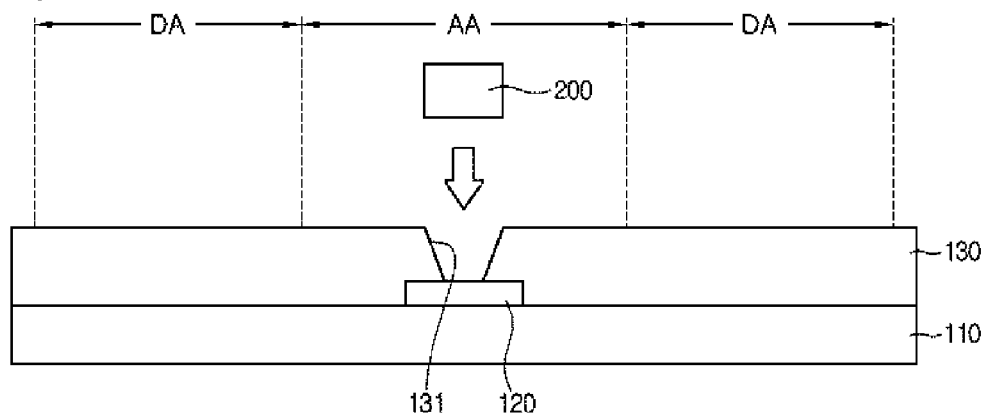

Next, as shown in FIG. 5, the via hole 131 to which the first circuit pattern 120 is exposed is formed in the insulating layer 130. The via hole 131 may be formed to have a side surface which is inclined at a predetermined angle to a plane of the substrate as shown in FIG. 5. Unlike this, the via hole 131 may be also formed to have a side surface which is vertical to the plane of the substrate.

The via hole 131 may be formed using a laser as illustrated in FIG. 5. At this time, the laser may use an UV laser or a $CO_2$ laser. At this time, the laser may use an UV laser or a $CO_2$ laser.

Figure 6:
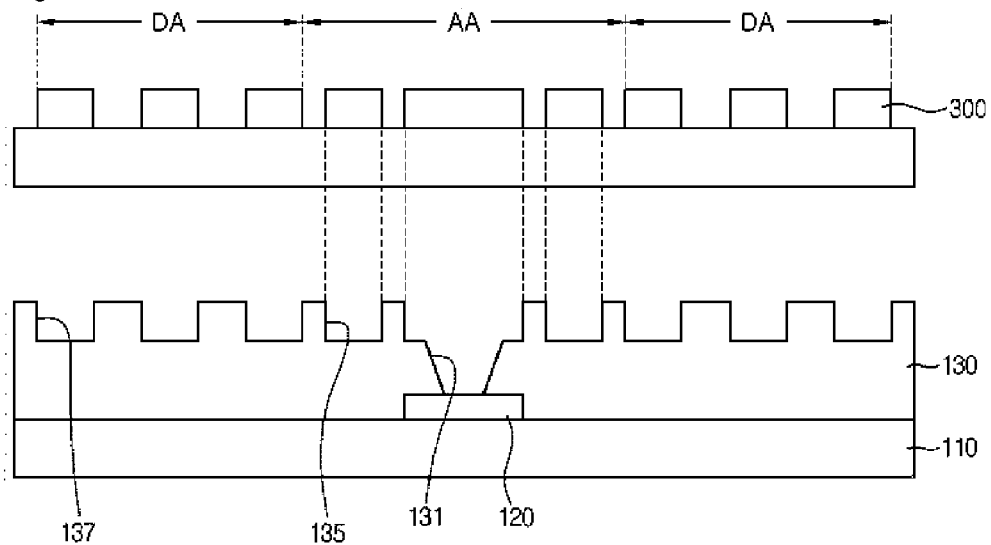

Also, the via hole 131 may be formed by a physical method, namely, a drill process, or may be also formed by selectively etching it with a chemical method Next, as shown in FIG. 6, the circuit pattern grooves 135, 137 for forming the circuit pattern 153 and the dummy pattern 151 are formed in the insulating layer 130. In the case of FIG. 6, the circuit pattern groove 135 may be formed using an excimer laser for emitting a laser beam having a wavelength of an ultraviolet area. A KrF excimer laser (i.e. krypton fluoride laser having center wavelength of 248 nm), or an ArF excimer laser (i.e. argon fluoride laser having center wavelength of 193 nm) and the like may be applied to the excimer laser.

In a case where the circuit pattern groove 135 is formed using the excimer laser, the circuit pattern groove 135 may be formed by forming a pattern mask 300 for simultaneously forming the circuit pattern groove 135, and the dummy pattern groove 137 and selectively irradiating the excimer laser through the pattern mask 200.

As shown in FIG. 6, the dummy pattern groove 137 for forming the dummy pattern 151 is formed in the dummy area (DA) by irradiating a laser beam thereto, and the second circuit patterns 153 are formed in the active area (AA).

As shown in FIG. 6, in the dummy area (DA), the dummy pattern groove 137 for forming the dummy pattern 151 is formed by irradiating the laser. In the active area, the second circuit patterns 153 are formed.

The dummy pattern groove 137 may be uniformly disposed in the dummy area, and may be formed to satisfy less than 50 μm in width.

A region in which the via hole 131 is formed forms a groove having a larger area than an exposed upper surface of the via hole 13 so that the via hole 135 may have a layered structure.

In a case where the via hole 131 is formed in the layered structure, the extended upper surface of the via hole 131 may be used as a pad for mounting a device so that an area for mounting the device may be secured.

Figure 7:
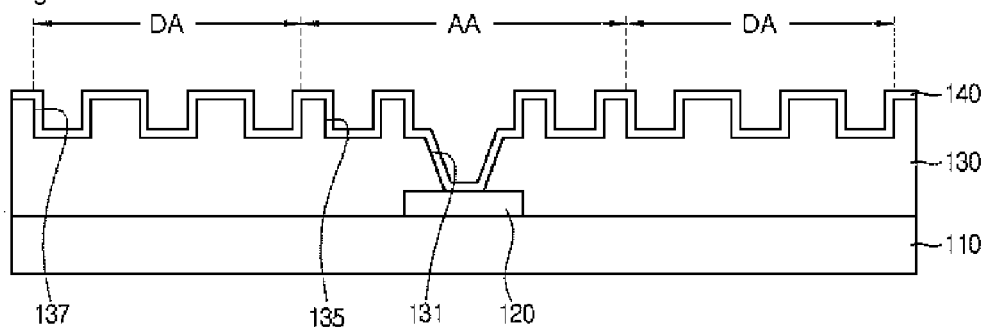

Next, as shown in FIG. 7, the metal layer 140 is formed on the insulating layer 130.

The metal layer 140 is formed all over the surface of the printed circuit board 100, namely, all over the active area (AA) and the dummy area (DA).

The metal layer 140, which is a conductive seed layer, is formed by first removing a smear from the insulating layer 130, and performing a desmear process of providing roughness in order to improve a bonding force.

The metal layer 140 may be formed by an electroless plating method.

The electroless plating method may be conducted in the order of a degreasing process, a soft corrosion process, a spare catalyst treatment process, a catalyst treatment process, an activating process, an electroless plating process and a treatment process for preventing oxidation. Also, the metal layer 140 may be formed by sputtering metal particles using plasma.

The metal layer 140 is formed of an alloy including Cu, Ni, Pd or Cr.

Figure 8:
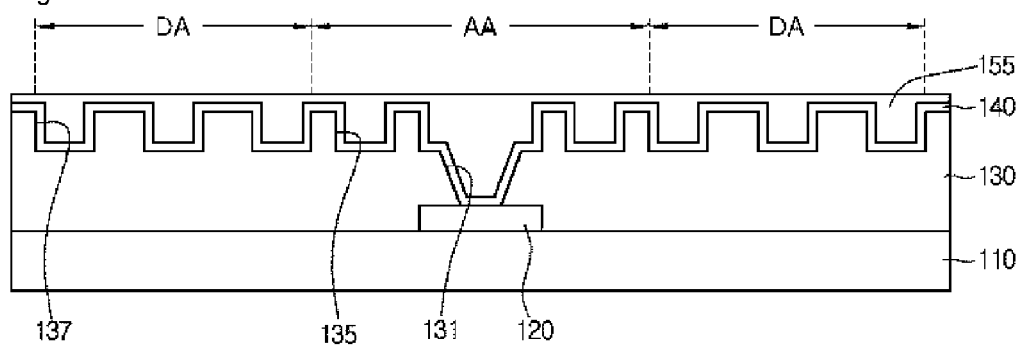

Next, a plated layer 155 of FIG. 8 is formed by electrolytic plating the metal layer 140 as the seed layer with a conductive material.

The plated layer 155 is formed to be filled with the dummy pattern groove 137 of the dummy area DA, the circuit pattern groove 135 of the active area AA, and the via hole 131 so that a height of the uppermost layer of the plated layer 155 may be uniformly formed.

At this time, the plated layer 155 may be formed of Cu having high conductivity.

Figure 9:
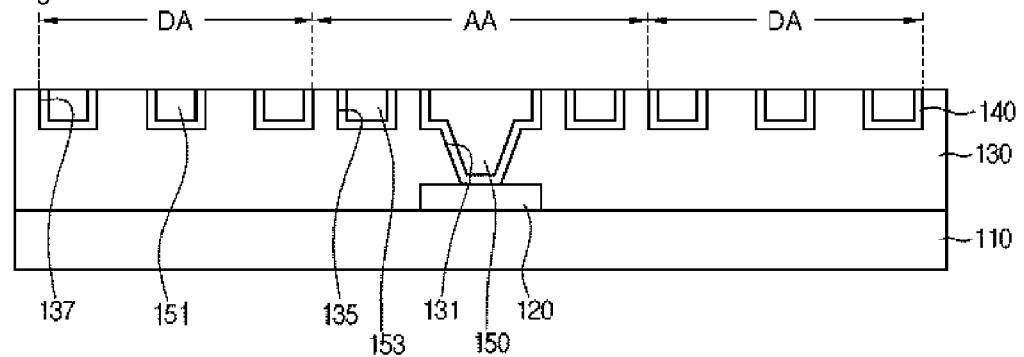

Last, as shown in FIG. 9, a chemical and physical etching process is performed to remove the plated layer 155 from the insulating layer 130.

That is, referring to FIG. 9, the printed circuit board 100 is disposed on a grinder, and the plated layer 155, which is excessively plated, is ground using a slurry, which contains ammonia as a main component, and into which a small amount of hydrogen peroxide is added, at an alkali atmosphere of more than pH9.

The grinder rotates and induces physical etching of the slurry and the plated layer which is excessively plated.

Accordingly, like FIG. 9, by the chemical and physical etching process, the metal layer 155 is etched until the insulating layer 130 is exposed. The grinding is completed without the plated layer 155 which remains on the insulating layer 130.

The grinder may have a heating wire so that heat is transmitted to the printed circuit board 100.

The printed circuit board 100 having a size of more than 510 mm and 410 mm in length and breadth may be simultaneously etched by the chemical and physical etching process, thereby enabling the process for removing the plated layer having a large area to be performed.

Like this, the etching process is performed until the insulating layer 130 is exposed, and the plated layer 155 is formed in only the pattern groove 135 and the via hole 141. Thus, the second circuit patterns 153, the dummy pattern 151, and the via 150 are formed, an insulation state of the second circuit patterns 153 may be maintained, and the active area (AA) and the dummy area (DA) may be insulated.

Since the dummy pattern groove 137 is formed in the dummy area DA, and the dummy pattern 151 is simultaneously formed with the second circuit patterns 153, no difference in plating is generated when the plated layer 155 is formed. Thus, the etching may be uniformly performed, and the second circuit patterns may be accurately formed.

Hereinafter, an example to which the present invention is applied will be explained with reference to FIG. 10 and FIG. 11.

Figure 1:
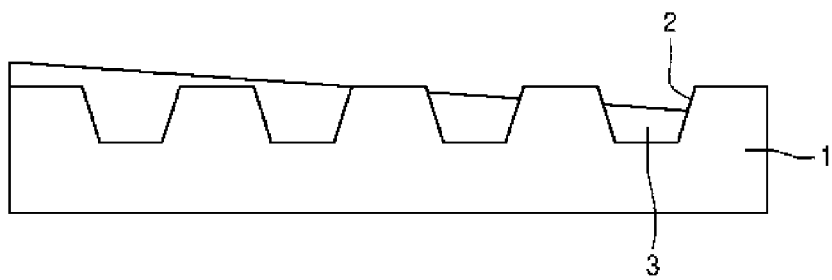
FIG. 1 is a cross-sectional view of a printed circuit board according to a conventional art.
Figure 10:
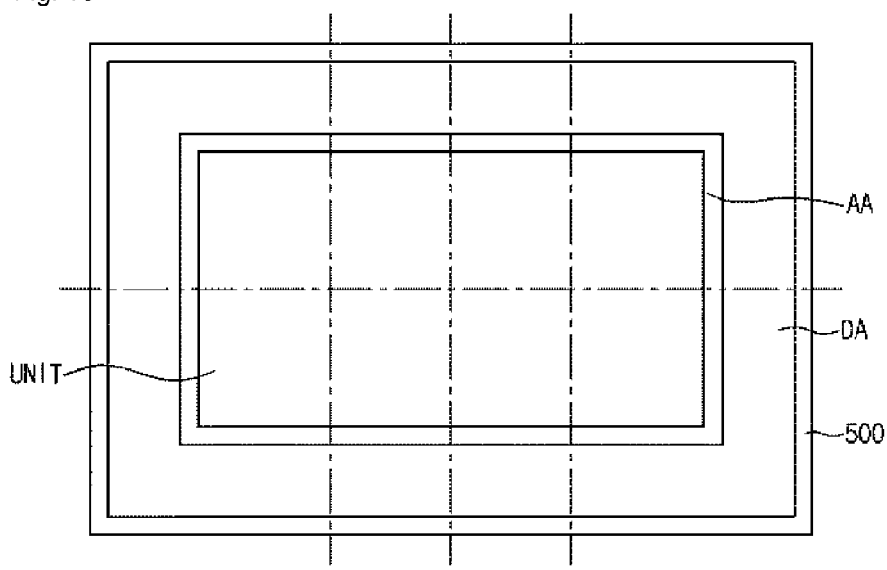
FIG. 10 is a plane view showing a panel of the printed circuit board of FIG. 1.

FIG. 10 is a plane view showing a panel of the printed circuit board of FIG. 1.

FIG. 10 illustrates one panel 500 including a plurality of printed circuit board units for which the processes are simultaneously performed during the manufacturing process.

The panel 500 of FIG. 10 includes the active area AA in which the plurality of printed circuit board units are formed, and the dummy area DA surrounding the active area AA.

The active area AA includes the plurality of printed circuit board units which are separated from each other. The printed circuit board units are individually used by being cut into each unit by a post process.

The dummy area DA is spaced apart from the active area AA as much as a predetermined distance to be electrically separated from the active area AA. Also, the dummy area (DA) is formed in a part of the panel 500 except for the active area AA.

At this time, as shown in FIG. 2, the dummy patterns are simultaneously and uniformly formed with the circuit pattern of the active area AA so that the circuit pattern of the active area AA is formed without a difference in plating, thereby preventing over-etching or non-etching from being generated.

Figure 11:
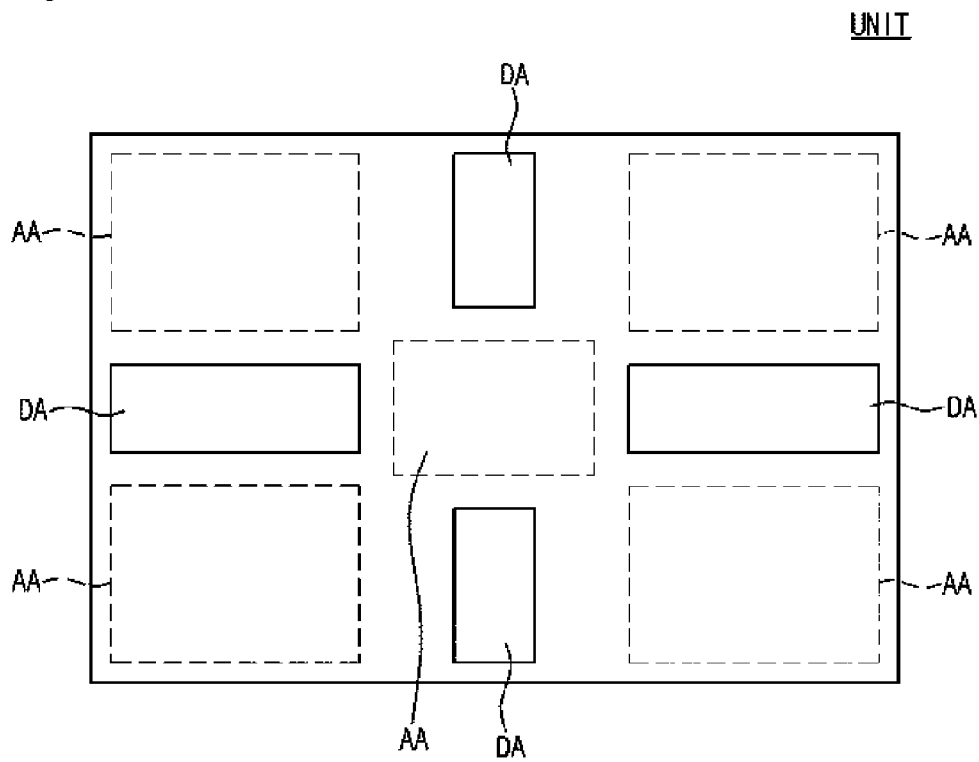
FIG. 11 is a plane view showing each unit of the printed circuit board of FIG. 1.

FIG. 11 is a plane view of each unit of the printed circuit board of FIG. 1.

One panel 500 of FIG. 11 is cut into each printed circuit board unit, and the printed circuit board units of FIG. 11 include the plurality of active areas AA and the plurality of dummy areas DA.

At this time, the dummy area DA means an area between the respective active areas AA or an area except for the active area AA.

Each printed circuit board unit includes the plurality of dummy areas DA. As explained in FIG. 2, each dummy area (DA) includes the plurality of dummy patterns which are simultaneously formed with the second circuit patterns.

Accordingly, since the circuit pattern of the active area AA is formed without a difference in plating, the circuit patterns may be uniformly formed without the occurrence of over-etching or non-etching.

Figure 12:
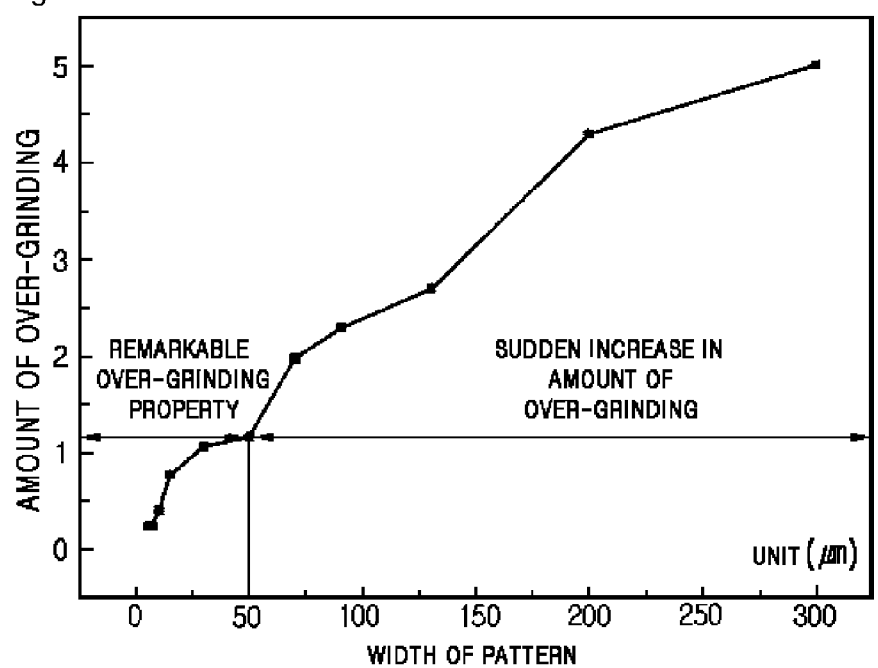
FIG. 12 is a graph showing each grinding property according to a width of a dummy pattern of the present invention.

FIG. 12 is a graph showing a grinding property according to a width of the dummy patterns of the present invention.

Referring to FIG. 12, a state of the over-grinding of the second circuit is observed with adjustment in the width of the dummy patterns.

Referring to the graph, when a width of the dummy pattern which is uniformly formed in the dummy area is less than 50 μm, a remarkable over-grinding property may be observed.

Accordingly, by controlling the width of the dummy patterns in less 50 μm, the circuit pattern can be prevented from being excessively ground upon the chemical and physical etching process and the buried circuit pattern can be uniformly formed.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A printed circuit board, comprising:
an insulating plate divided into an active region, a dummy region surrounding the active region, and an insulating region between the active region and the dummy region;
first circuit patterns patterned on the active region of the insulating plate;
an insulating layer on the active region, the dummy region, and the insulating region of the insulating plate;
vias formed within the insulating layer corresponding to the active region of the insulating plate and connected to the first circuit patterns, respectively;
second circuit patterns formed in circuit pattern grooves formed on a surface of the insulating layer corresponding to the active region of the insulating plate; and
dummy patterns formed in dummy pattern grooves formed on a surface of the insulating layer corresponding to the dummy region of the insulating plate,
wherein a shape of the dummy patterns is the same as that of the second circuit patterns, and
wherein a printed circuit board unit includes only the active region and is formed by separating the active region from the dummy region by cutting.

2. The printed circuit board of claim 1, wherein the vias are formed within via holes formed in the insulating layer.

3. The printed circuit board of claim 2, further comprising a metal layer formed by plating surfaces of the via holes, wherein the vias are formed on the metal layer to bury the via holes.

4. The printed circuit board of claim 3, wherein the metal layer contains at least one of Cu and Ni.

5. The printed circuit board of claim 1, wherein the via contains at least one of Al, Cu, Ag, Pt, Ni, and Pd.

6. The printed circuit board of claim 1, further comprising a metal layer formed by plating surfaces of the circuit pattern grooves, wherein the second circuit patterns are formed on the metal layer to bury the circuit pattern grooves.

7. The printed circuit board of claim 1, wherein the vias and the second circuit patterns are made of the same material.

8. The printed circuit board of claim 1, further comprising a metal layer formed by plating the dummy pattern grooves, wherein the dummy patterns are formed on the metal layer to bury the dummy pattern grooves.

9. The printed circuit board of claim 1, wherein a width of the dummy pattern is formed in a range of 50 μm or less.

10. The printed circuit board of claim 1, wherein the vias and the dummy patterns are made of the same material.

11. The printed circuit board of claim 1, wherein the first circuit patterns and the insulating plate form a copper clad laminate (CCL).

* * * * *